US012811387B2

(12) United States Patent
Yurick et al.

(10) Patent No.: US 12,811,387 B2
(45) Date of Patent: Nov. 24, 2026

(54) INTEGRITY TESTING OF SAFETY INTERLOCKS IN TEST AND MEASUREMENT SYSTEMS

(71) Applicant: Keithley Instruments, LLC, Solon, OH (US)

(72) Inventors: Benjamin J. Yurick, Garrettsville, OH (US); Mark D. Zimmerman, Twinsburg, OH (US)

(73) Assignee: Keithley Instruments, LLC, Solon, OH (US)

( * ) Notice: Subject to any disclaimer, the term of this patent is extended or adjusted under 35 U.S.C. 154(b) by 211 days.

(21) Appl. No.: 18/629,768

(22) Filed: Apr. 8, 2024

(65) Prior Publication Data

US 2024/0348040 A1 Oct. 17, 2024

Related U.S. Application Data

(60) Provisional application No. 63/458,770, filed on Apr. 12, 2023.

(51) Int. Cl.

| | |
|---|---|
| ***H02H 3/44*** | (2006.01) |
| ***G01R 31/08*** | (2020.01) |
| ***H02H 1/00*** | (2006.01) |

(52) U.S. Cl.

CPC ........... *H02H 3/445* (2013.01); *G01R 31/086* (2013.01); *H02H 1/0092* (2013.01)

(58) Field of Classification Search

CPC .. G01R 19/155; G01R 31/66; G01R 31/3648; G01R 31/327; G01R 31/52;

(Continued)

(56) References Cited

U.S. PATENT DOCUMENTS

| | | | | |
|---|---|---|---|---|
| 4,392,176 A * | 7/1983 | Kneip | .................... | H01H 3/141 361/189 |
| 5,281,857 A * | 1/1994 | Keese | .................. | H01H 47/005 307/328 |

(Continued)

FOREIGN PATENT DOCUMENTS

| | | |
|---|---|---|
| CN | 104460350 A | 3/2015 |
| CN | 204389917 U | 6/2015 |

(Continued)

OTHER PUBLICATIONS

"Keysight 34980 Data Acquisition System," 34980A Service Guide—Copyright 2006-2019, Keysight Technologies, Edition 9, Aug. 20, 2019, Malaysia, 149 pages, Retrieved from the internet: https://keysight-docs.s3-us-west-2.amazonaws.com/keysight-pdfs/34945EXT/34980A+Multifunction+Switch+Measure+Unit+-+Serv.pdf.

(Continued)

*Primary Examiner* — Vinh P Nguyen
(74) *Attorney, Agent, or Firm* — Miller Nash LLP; Andrew J. Harrington; Krista Y. Chan

(57) ABSTRACT

A test and measurement system includes one or more high voltage sources having a voltage high enough to be dangerous to users, an instrument backplane, having one or more backplane double fault protected interlocks, a power signal, and one or more slots configured to accept one or more modules, and one or more processors configured to execute code that causes the one or more processors to: monitor one or more signals from the one or more backplane double fault protected interlocks; and without engaging any of the one or more high voltage sources, determine an operational state and faulted condition of each of the one or more backplane double fault protected interlocks, and check wiring of an interlock pathway between the test and measurement instrument and a user system.

19 Claims, 8 Drawing Sheets

(58) Field of Classification Search
CPC .. G01R 31/3842; G01R 31/007; G01R 31/68; G01R 31/086; G01R 31/28; G01R 31/2849; G01R 31/31701; G01R 31/3275; G01R 31/67; G01R 31/50; G01R 31/54; G01R 31/56; G01R 31/14; G01R 35/00; G05B 19/042; G05B 19/0428; G05B 23/0216; G05B 19/058; G05B 2219/14006; G05B 2219/34465; H02H 1/0092; H02H 3/445
See application file for complete search history.

(56) References Cited

U.S. PATENT DOCUMENTS

| | | | | |
|---|---|---|---|---|
| 5,870,317 | A * | 2/1999 | Barnett | G05B 23/0256 307/115 |
| 6,937,450 | B1 * | 8/2005 | Mayer | B23Q 5/58 361/42 |
| 7,084,361 | B1 * | 8/2006 | Bowes | B60L 3/04 200/16 R |
| 7,243,038 | B2 | 7/2007 | Dowland et al. | |
| 7,586,722 | B2 * | 9/2009 | Scholer | B60L 3/0069 361/88 |
| 7,634,320 | B2 | 12/2009 | Sakurai | |
| 7,933,663 | B2 | 4/2011 | Teranisi et al. | |
| 7,999,668 | B2 | 8/2011 | Cawthorne et al. | |
| 8,014,115 | B2 | 9/2011 | Vincente et al. | |
| 8,280,653 | B2 | 10/2012 | Lagree | |
| 8,693,159 | B2 | 4/2014 | Jones et al. | |
| 9,046,581 | B2 | 6/2015 | Turgeon | |
| 9,188,646 | B2 | 11/2015 | Mohtasham et al. | |
| 9,733,303 | B2 | 8/2017 | Schaedlich | |
| 10,557,889 | B2 | 2/2020 | Montoya et al. | |
| 11,292,698 | B2 | 4/2022 | Stagg | |
| 11,586,573 | B2 | 2/2023 | Applied | |
| 2021/0232115 | A1 | 7/2021 | Tu et al. | |
| 2022/0291278 | A1 | 9/2022 | Sobolewski et al. | |

FOREIGN PATENT DOCUMENTS

| | | | |
|---|---|---|---|
| CN | 107562625 | A | 1/2018 |
| CN | 107831392 | A | 3/2018 |
| CN | 108216314 | A | 6/2018 |
| CN | 110990297 | A | 4/2020 |
| CN | 112198815 | A | 1/2021 |
| CN | 110038232 | B | 4/2021 |
| CN | 112765020 | A | 5/2021 |
| CN | 113740631 | A | 12/2021 |
| CN | 111856174 | B | 1/2022 |
| CN | 114691488 | A | 7/2022 |
| JP | 5204401 | A2 | 8/1993 |
| JP | 8005675 | A | 1/1996 |
| JP | 2018191463 | A | 11/2018 |
| KR | 218390 | Y1 | 4/2001 |
| WO | 2017208421 | A1 | 12/2017 |

OTHER PUBLICATIONS

International Organization for Standardization (2015), "Safety of machinery—Safety-related parts of control systems—Part 1: General principles for design" (ISO Standard No. 13849-1:2015(en)), Section 3: Terms, definitions, symbols and abbreviated terms. pp. 4-10, Retrieved from the internet: https://www.iso.org/obp/ui/#iso:std:iso:13849:-1:ed-3:v1:en.

Datasheet, "Switching and Control," Keithley 2013 (70 pages). Retrieved from the internet: https://download.tek.com/datasheet/Switching2.pdf.

Agilent Technologies, Inc., Aug. 2012, 183 pages, Malaysia, "Agilent 34934A High Density Matrix Module", xdevs.com, Retrieved from the internet: https://xdevs.com/doc/HP_Agilent_Keysight/34980A/34980-90034%2034934A%20High%20Density%20Matrix%20Module%20-%20User%27s%20Guide%20c20141031%20%5B65%5D.pdf.

"Electrical Safety & Test Equipment—Vitrek", vitrek.com Catalog, Virtek, 2020 (48 pages), Retrieved from the internet: https://www.vitrek.com/library/Vitrek_Catalog.pdf.

* cited by examiner

INTEGRITY TESTING OF SAFETY INTERLOCKS IN TEST AND MEASUREMENT SYSTEMS

CROSS-REFERENCE TO RELATED APPLICATIONS

This disclosure is a non-provisional of and claims benefit from U.S. Provisional Application No. 63/458,770, titled "SAFETY INTERLOCK FOR INSTRUMENTS AND SYSTEMS," filed on Apr. 12, 2023, the disclosure of which is incorporated herein by reference in its entirety.

TECHNICAL FIELD

This disclosure relates to test and measurement instruments and systems, and more particularly to a safety interlock for a test and measurement instrument or system.

BACKGROUND

Test and measurement instruments and systems, referred to here as systems, such as source measure units (SMUs), power supplies, etc., can benefit from including a safety interlock system. The interlock system prevents users and user machines from exposure to dangerous voltages when it detects a fault system and/or in wiring between the instrument and a user's device under test (DUT). The system only energizes, or connects to, the dangerous hardware, meaning hardware that operates at high or "dangerous" voltages, when the external wiring path remains unbroken. This eliminates the possibility of energizing the dangerous hardware when an event like opening an external door or enclosure occurs.

FIG. 1 shows a conventional safety interlock scheme. This scheme consists of a power supply, typically 5V, 10 enabled by the signal 5VINT_EN, and a mainframe relay 12. The interlock supply 20 provides power to the two relays of independent contacts 14 and 16 to close a hardware path to enable downstream hardware on a module that is "interlocked."

The downstream hardware may comprise high voltage or high current power supplies that can be considered dangerous to the end user. Generally, the user provides the external wiring 18 to the coil of this interlock relay and possibly wire it through external devices like door switches, hall sensors or similar. The system then only energizes the dangerous hardware when the external wiring path remains unbroken.

The interlock relay in this case is a safety-controlled component for test instrument manufacturers, and the implementation must use a redundant set of contacts to ensure a "double" fault protected design. If a relay contact fails and is stuck closed, one more set of independent contacts remains operational keeping the interlock function working preserving the safety aspect of the equipment. This type of interlock has two serious disadvantages.

First, the interlock lacks failure detection. The interlock relay has double fault protection, but the possibility exists that one contact is faulty without knowing or showing any change in operation. The interlock status signal INT_STATUS continues to show the relay as being okay. Therefore, the interlock does not detect or indicate that a single fault has occurred in the hardware that could invariably fail one day. If a single fault has occurred, a safety-conscientious user would like to know if the double-fault system has become single-fault system. The compromised system should undergo repairs, but the system must first indicate the failure.

Second, the interlock design results in difficulties in troubleshooting. In the case that the user discovers the interlock function has failed, the simplistic nature of the wiring and hardware implementation in FIG. 1 does not lend itself to identifying where the problem occurred. In moderately complex systems, troubleshooting could require that hardware become completely disconnected and taken offline while somebody figures out and repairs the issue.

DETAILED DESCRIPTION

Figure 1:
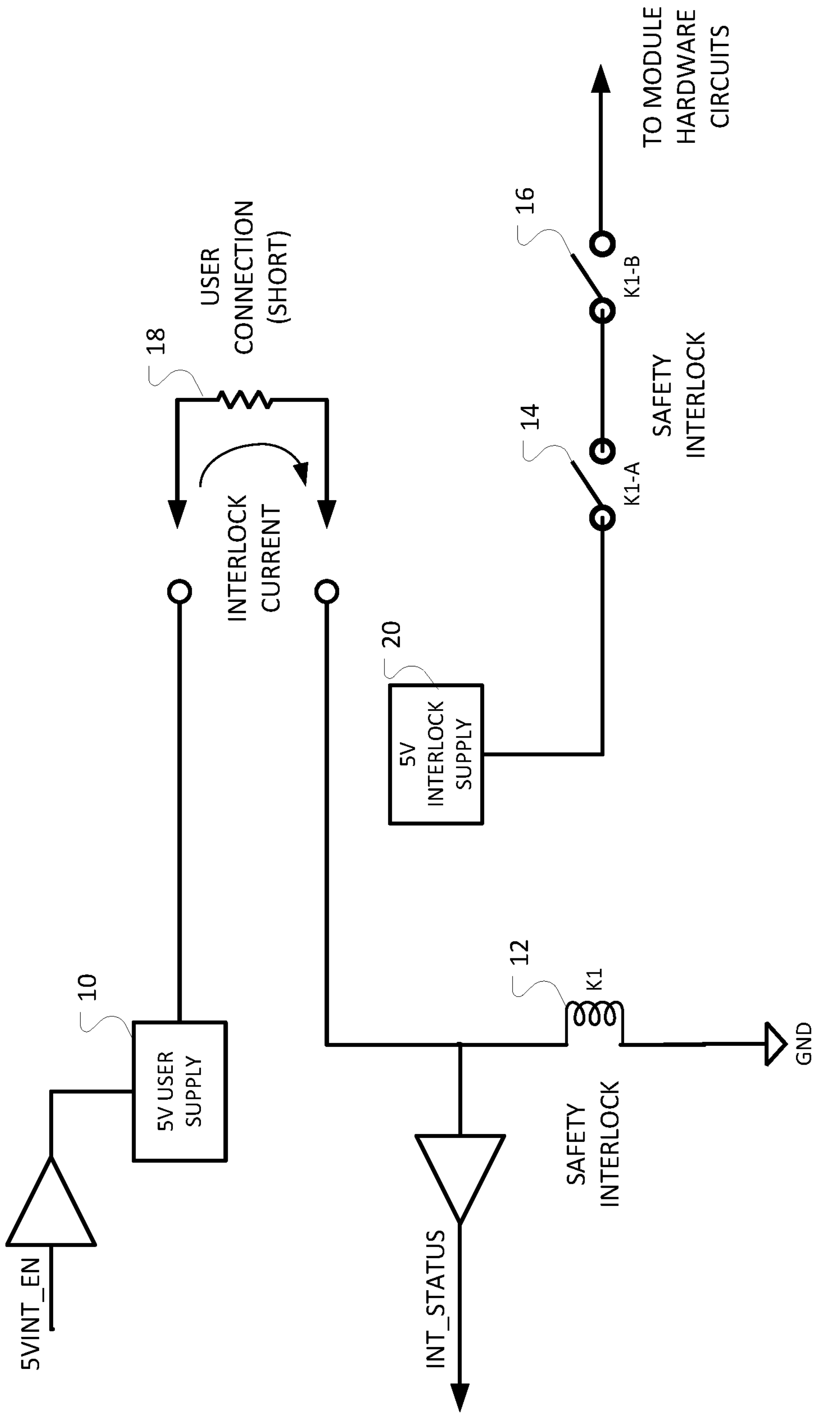
FIG. 1 shows an implementation of a conventional hardware safety interlock.

In contrast to the more simplified interlock systems such as that set out in FIG. 1, embodiments herein solve both deficiencies listed above as well as moving test and measurement instrumentation more toward a machine level of safety standards. Standard EN ISO13849-1:2015, Category 3, sets out an example of machine level safety standards, as desired by some users.

Further, benefits exist for such an interlock system to perform a self-check or self-test of the interlock system and report to the user on the integrity of the interlock system. Such an interlock system, according to embodiments herein, provides a test system allowing users to have confidence in the safety of their end applications and the connections between the test system and the DUT.

Figure 2:
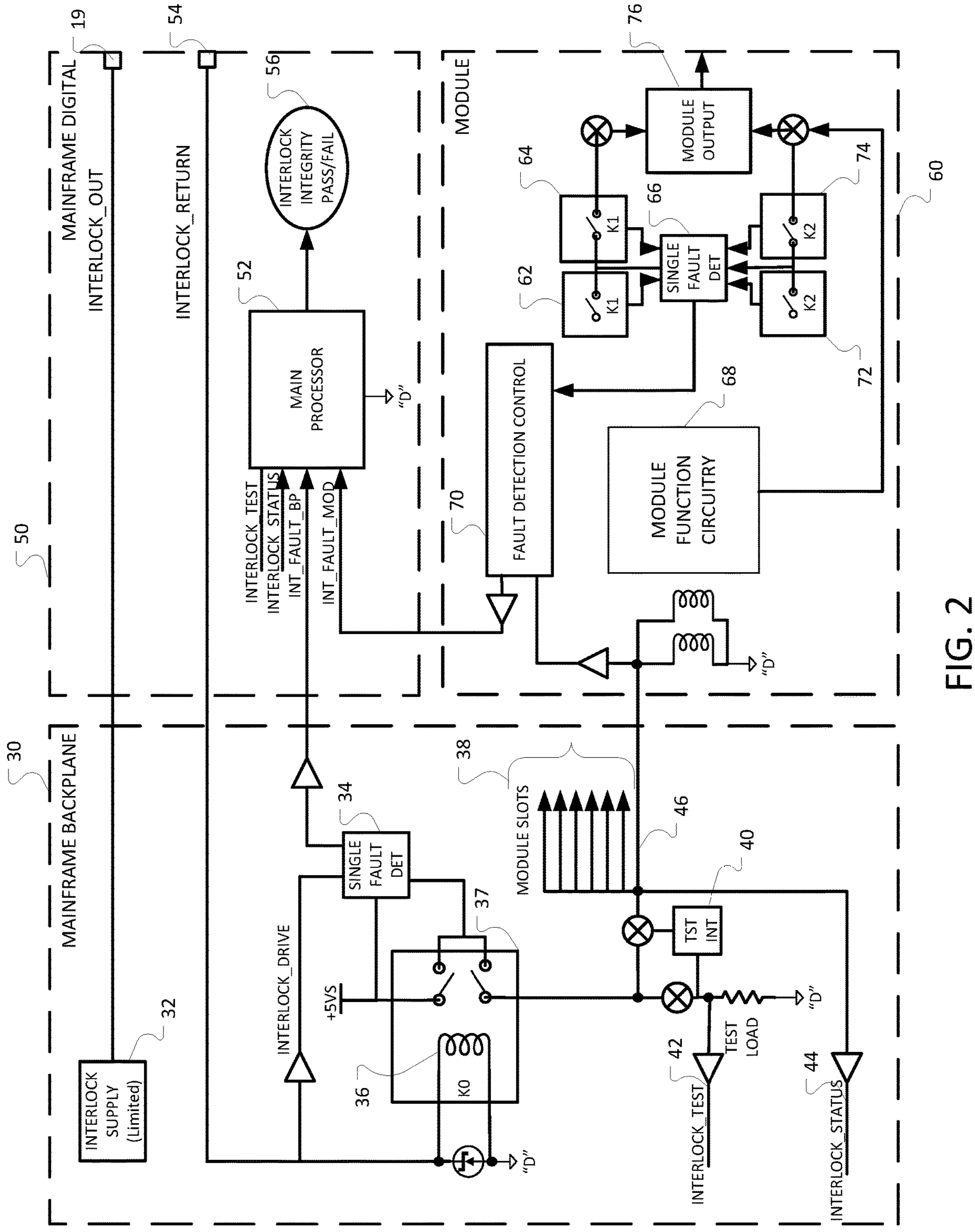
FIGS. 2-3 shows views of embodiment of an enhanced interlock system having a module.

FIG. 2 shows a block diagram of an embodiment of an interlock system according to some embodiments of the disclosure. The example interlock system of FIG. 2 may comprise a modular source measure unit (SMU) instrument, or other test and measurement instrument, including power supplies and others, employed in systems using high voltage and/or high current power supplies, referred to here as "dangerous" signals. The test and measurement instrument here comprises a mainframe backplane 30, a mainframe digital processing unit 52 in a digital mainframe 50, and an instrument module 60, such as the illustrated SMU module, which may reside in one of several mainframe backplane slots. The module is optional, but it is helpful to show the ability of the system to monitor all aspects of the system. The system can include any number of instrument modules, which are coupled to the mainframe backplane 30 and/or to the digital mainframe 50.

The mainframe consists of the interlock relay hardware along with additional hardware to support internal testing of the relay and power supply capability. Additionally, the interlock power signal is distributed to the six locations in the mainframe module interfaces to support modules with an interlock function. A main digital processor collects signals from the hardware in order to process a result of the integrity test. All signals and nodes throughout the interlock subsystem are buffered and monitored by this digital system design to establish the internal health of the whole interlock system at any time. An example module shown employs an interlock system for its particular outputs. The modules may vary in design, but may have a consistent hardware implementation of interlock so as to support this overall scheme. The architecture of the modules also contains a digital subsystem design which collects the status of its internal interlocks and reports it back to the main digital system for use during the overall interlock testing.

In the example of FIG. 2, features of the interlock system are distributed between the mainframe backplane 30, the instrument module 60, and the mainframe digital processing unit 52, which is a part of the mainframe digital 50. Embodiments of the disclosure add capabilities in both the mainframe backplane and each instrument module that plugs into the mainframe backplane. In this way, the modules become part of the integrity test, which can test everything from the user wiring to the instrument module.

One aspect of the interlock system shown in FIG. 2 involves a hardware interlock to detect when a single fault has occurred on a safety critical component. In these embodiments the hardware interlock comprises a relay without limitation to that particular safety critical component. One example of this feature is shown by the “Single Fault Detection” block 34 on the mainframe backplane 30. The “Single Fault Detection” block 34 accepts inputs from the “INTERLOCK_DRIVE” signal, as well as the relay K0 36 of the backplane interlock 37, and outputs an “INT_FAULT_BP” signal to mainframe digital processing unit 52. Other components of the mainframe backplane 30 send and receive various signals that enable the monitoring and testing of the different elements of the interlock systems.

As shown in FIG. 2, the mainframe backplane 30 has an interlock supply 32 that provides power, typically 5V, via the INTERLOCK_OUT signal to the external wiring 18 coupled to contact 19. The user system returns an INTERLOCK RETURN signal via contact 54 that connects to relay K0 36 on the backplane interlock 37. The backplane interlock 37 has double fault protection. The components at the lower portion of the mainframe backplane 30 enable testing the interlock at TST INT (test interlock) 40, the INTERLOCK_TEST signal 42, and the INTERLOCK_STATUS signal 44. These signals are received by the mainframe digital processing unit 52. The TST INT 40 receives the signals from the instrument module interlock on line 46, and the backplane interlock 37 to generate the INTERLOCK_TEST signal.

The modules slots 38 allow the mainframe backplane 30 to provide different capabilities, such as SMU, power supplies of different capabilities, different types of power supplies and the like. The different modules insert into one of the slots shown. When a module is present, the INTERLOCK STATUS signal for the interlock on the module appears on line 46 that interfaces with the mainframe backplane 30. The module may include many different types of components to provide the functionality needed the prompted the insertion of the module. The discussion herein describes module 60, and any functionality attributed to module 60 can be applied to any module coupled to the mainframe backplane 30. The module 60 has relays 62, 64, 72, and 74, connected to the Single Fault Detection circuit 66. If any of these relays 62, 64, 72, and 74 stick or otherwise fail, the Single Fault Detection circuit 66 on the module 60 provides a signal to fault detection control 70, and ultimately to the mainframe digital processing unit 52 as the INT_FAULT_MOD signal.

Each Single Fault Detection circuit from the mainframe backplane 30 or the module 60 can detect if the associated relay has failed without interrupting its normal operating behavior and preserving the fail-safe nature of it. The mainframe digital processing unit 52 takes the fault signals from the Single Fault Detection blocks and applies logic to determine if a fault of a safety critical component has occurred. The module 60 also has module function circuitry 68 that provides a corresponding module output 76. Modules, such as module 60, may include high voltage coils, etc. Similarly, the module function circuitry 68 produces the module output 76 if the interlocks function correctly. If the interlocks do not work correctly, the module output 76 does not occur.

Another aspect of the interlock system shown in FIG. 2 comprises a hardware method to allow the user to test the interlock integrity of the complete system and produces output 56. FIG. 2 shows this feature by the TST INT 40 on the mainframe backplane 30. This feature includes a particular hardware design to simulate the interlock system without engaging the modules, where the dangerous voltages reside, to allow the user to identify if the system setup including the user’s own external wiring, and the instrument’s internal hardware, has a problem. This discussion refers to this simulation as an “integrity test,” a simulation done with the instrument hardware. Once the user passes this integrity test, the user knows that when the user takes the instrument out of test mode and into run mode that system comprises a proven safe system. The mainframe digital processing unit 52 takes the results of the interlock “test” and decides whether the system passes or fails. Additionally, mainframe digital processing unit 52 reports if there is a single fault should it ever occur. The mainframe digital processing unit 52 provides the interface to the user to let them know these findings.

Together, these two aspects allow test and measurement instruments and systems according to embodiments of the disclosure to achieve compliance with standard EN ISO 13849-1:2015, Category 3.

Additional aspects of the example interlock system of FIG. 2 include all relays being safety rated UL508, including all relays K0 from interlock 37 on the mainframe backplane 30, K1 from the instrument module interlocks 62 and 64, and K2 from the other instrument module interlocks 72 and 74.

The module side interlock has 2 in-series redundant contacts with no hot switching resulting in improved life. The module 60 has single fault detection on relay contacts, as does the mainframe backplane 30. The mainframe side interlock integrity test process verifies both internal hardware and user connections prior to enabling the module 60. These are discussed below regarding FIGS. 7-10. The user side has an easy to drive, fault protected interlock interface. If a hardware fault occurs, the specific fault/component cannot be determined, only that a single fault has occurred.

Accordingly, embodiments of the disclosure provide several advantages over conventional interlock systems. These advantages include the capability to check the interlock hardware to ensure it is still operational and not in a faulted condition. The system also has the capability to check interlock hardware inside the module design to ensure its operability and does not have any faulted conditions. The system has additional hardware to support checking the external (user) wiring of the interlock pathway. In this way, the user can test and troubleshoot the external connection to solve wiring problems and achieve confidence that the user setup is okay.

With some software test sequences run, as discussed further below, all of this newly added hardware collectively can check the "health" of the internal interlock system. The interlock path from user to module can be completely simulated and checked in hardware without actual engagement so as to provide a complete "integrity test" and report results to the user. If the test passes, the user can be confident the interlock system has not experienced a single fault and will operate perfectly when actuated. Moreover, this testing can be put into the users test automation so the system can be checked over the life of the product, identifying any interlock hardware failure immediately at the time an interlock hardware failure occurs. The mainframe can be specified as compliant with safety standard EN ISO13849-1: 2015, Category 3 thereby setting a new expectation of safety/interlock design for test and measurement instrumentation users.

FIGS. 3-7 show circuit schematics for portions of an illustrative example implementation of an interlock system in the mainframe according to some embodiments of the disclosure. The discussion does not describe all circuit functions but does discuss the key signals and features. The implementation of the various circuits is left up to the designer.

Figure 3:
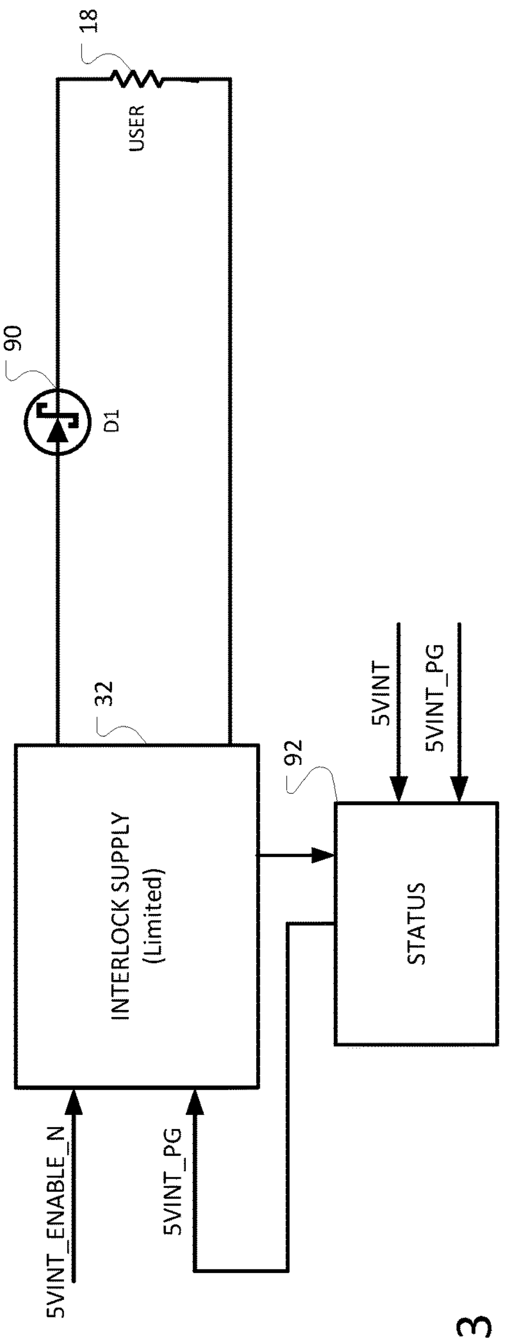

FIG. 3 shows a block diagram of the signals from the various portions set out in FIG. 2 used to allow the user to wire to the interlock through the user's external system, with some elements not shown in FIG. 2. The interlock supply 32 of FIG. 3 corresponds to the interlock supply 32 of FIG. 2. FIG. 3 contains design elements (not illustrated in FIG. 2), such as the diode 90 and the resistor 18, that provide over voltage and over current protections as well as monitoring 5VINT signal itself for faulty conditions. These design elements allow for internal fault detection of this power supply. Other elements not shown here are added for additional detection of open circuit conditions. The status block 92 provides the 5VINT_PG (power good) signal that may indicate whether the power supply signal itself has a fault. The status block 92 monitors all the signals from the interlock power supply and the user's return signal, as well as other signals to determine their state, such as in run mode, test mode, or if there is a fault, and to provide that status to the interlock. The hardware implementation of this status block 92 may comprise different circuit elements, but its importance lies in the monitoring of the power and the user status to ensure safe operation.

Figure 4:
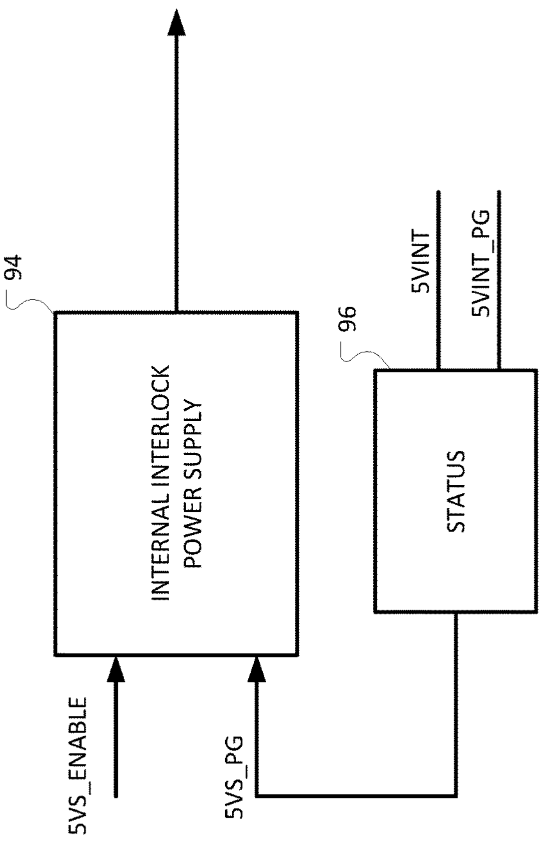
FIG. 4 shows an alternative embodiment of an enhanced interlock system.

This 5VS power supply 94 shown in FIG. 4 is used for the internal interlock power. This power supply 94 does not provide any power external to the mainframe backplane 30. Referring back to FIG. 2, FIG. 2 shows the power supply as the power supply for the backplane interlock 37. The system monitors the power supply 94 for overvoltage, undervoltage, or over current condition via the PG signal from the status block 96 (not illustrated in FIG. 2), which allows for internal fault detection of this separate power supply 94. Similar to the status block 92 in FIG. 3, the hardware in the status block 96 monitors the health of the power supply 94 used to power the internal interlock.

Figure 5:
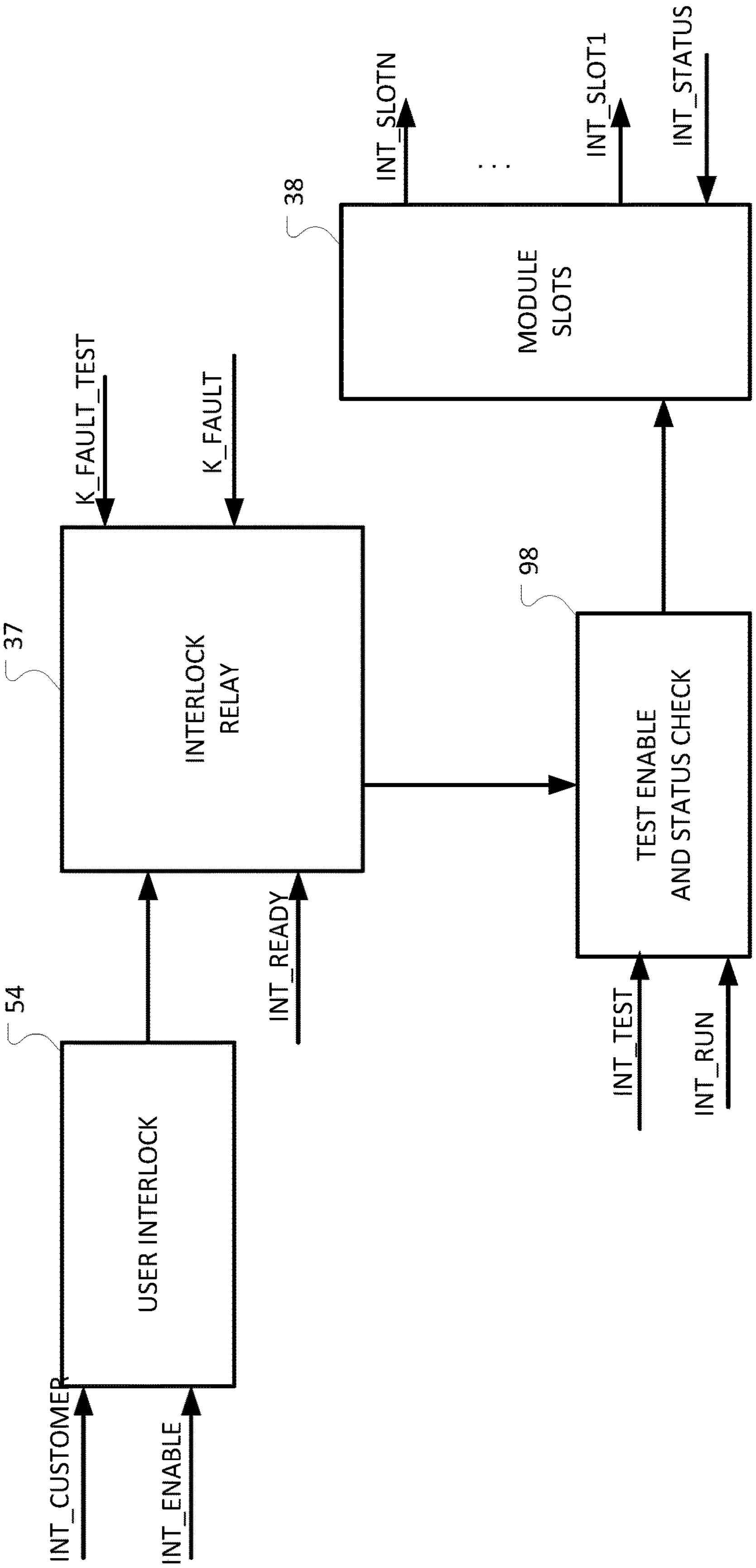
FIG. 5 shows embodiments of interlock relay and testing circuits.

This block diagram of FIG. 5 contains the safety relay K0 36 from the backplane interlock 37 from FIG. 2, and signals to enable tests and check the status of nearly every node involved in the interlock system at test enable at check circuit 98. Status check circuit 98 may comprise the TST INT circuit 40 from FIG. 2. The nodes include the user status at 54 and the modules via module slots 38, which are sent to the mainframe digital processing unit 52. The number of modules slots 38 may vary from 1 to N. The embodiment of FIG. 2 shows 6 slots, and the discussion may refer to distributing power to six locations, each for one slot, but that merely serves as an example. The operation is described in the flow charts below. Below are the descriptions about each signal.

TABLE I

| Signal | Description |
|---|---|
| 5VINT_PG | Internal 5 V power supply to the user power good signal. |
| 5VS_PG | Internal 5 V System supply used to power module interlocks routed to 6 locations. |
| INT_CUST | Interlock signal returned to instrument from user interlock wiring. |
| INT_EN | Enable signal used to enable interlock if user supply is present as well as force off for test. |
| INT_READY | Internal signal that represents if the interlock signal is at a valid level capable of energizing module interlocks. |
| INT_TEST | Internal signal used to put the interlock path under a load test representative of max module interlock loads. |
| INT_RUN | Internal signal that passes or disconnects the internal interlock signal from the module interlock connections. |
| K_FAULT_TEST | Internal signal that is used to test for an internal failure (stuck contact) on the safety interlock relay. |
| K_FAULT | Internal signal that is used to determine if an internal failure is present on the safety interlock relay. |
| INT_STATUS | Internal signal that represents the state of the module interlocks. |

Figure 6:
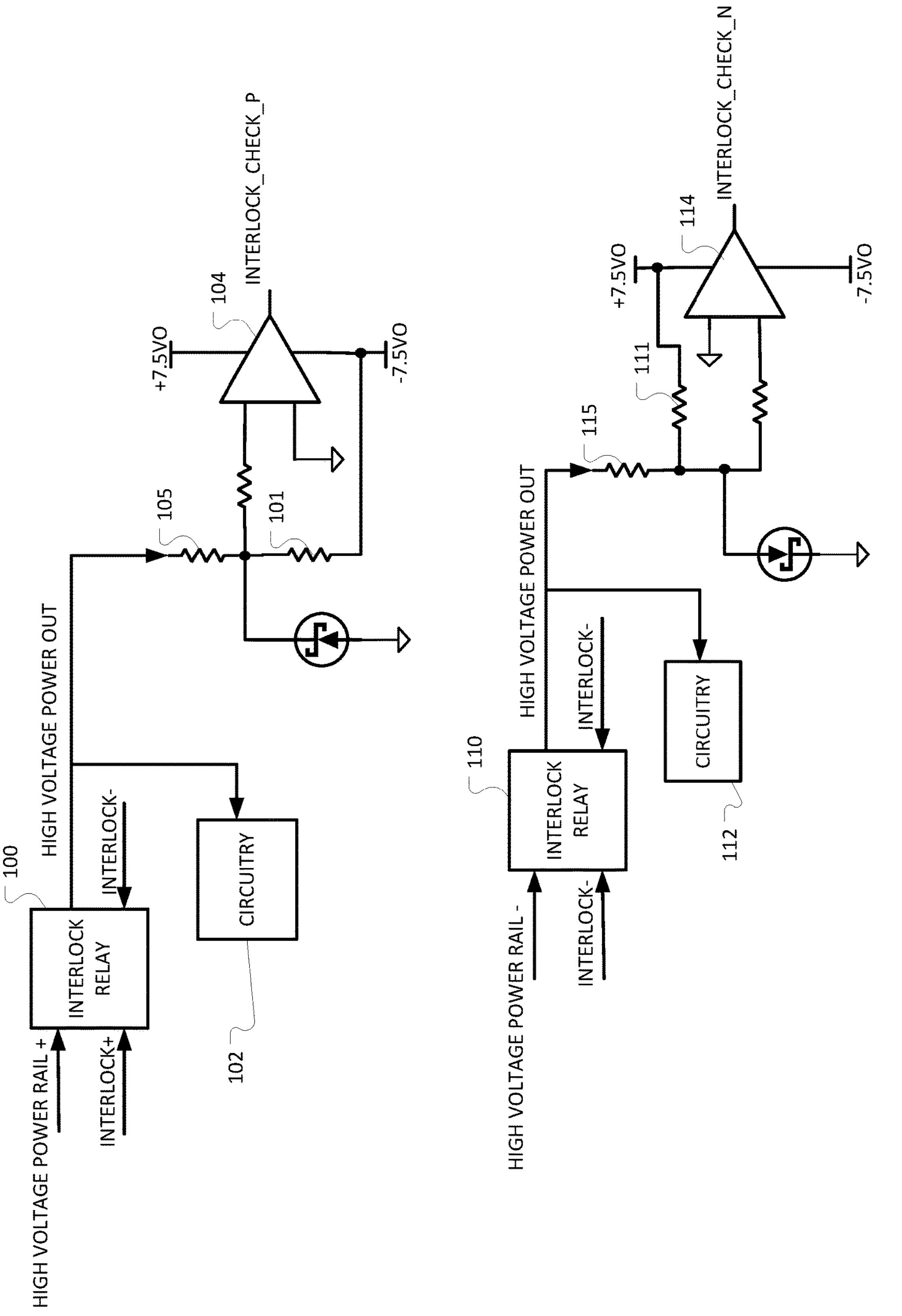
FIG. 6 show embodiments of module-side hardware for an interlock relay.

FIG. 6 shows an example of how the enhanced interlock system may exist in an example module design. FIG. 6 shows some hardware components for ease of understanding the below discussion and the discussion is not intended to imply that this particular example is how the module interlocks may function. The module-side hardware verifies that both contacts in the safety-controlled relays are open when they should be. The module-side hardware is only intended to report on the state of the relays when the interlock is open.

Under normal circumstances, when the interlock is open and both interlock relays 100 and 110 are functioning properly, a bias resistor 101 and 111, depending upon the rail, pulls the sensing node of the comparator 104 or 114 in the opposite direction of the rail that is being monitored. Resistor 101 pulls the sensing node negative for the comparator 104 monitoring the positive rail and resistor 111 pulls the sensing node positive for the comparator 114 monitoring the negative rail. In this situation, both comparators 104 and 114 output a low signal. This particular embodiment has positive and negative high voltage and lower voltage rails, with other circuitry 102 and 112 powered by the supplies. FIG. 6 merely provides an example of how the system implements the interlocks on the module to provide complete monitoring of the safety of the system.

However, if any of the four contacts does not fully open when the interlock should be open, that contact pulls the corresponding comparator towards that rail, causing either comparator 104 or comparator 114 to instead output a high signal. For example, if the contact on relay 100 does not open, the positive high voltage rail pulls the sensing node positive through resistor 105, causing the comparator 104 output to go high. A similar sequence occurs on the negative rail with resistor 115.

Having seen specific hardware implementations of the various circuit components, the discussion now turns to a discussion of the testing and monitoring of the various interlocks enabled by the overall architecture of the interlocks. One should note that the details of the implementations of the interlocks are left up to the designer, so long as the system allows the processor to monitor and test the interlocks, a process that has not been found in the current state of the art. One should also note that while the overall integrity test discussed below regarding FIG. 10, one could perform one or only a selection of the tests within the scope of the embodiments and claims.

Figure 7:
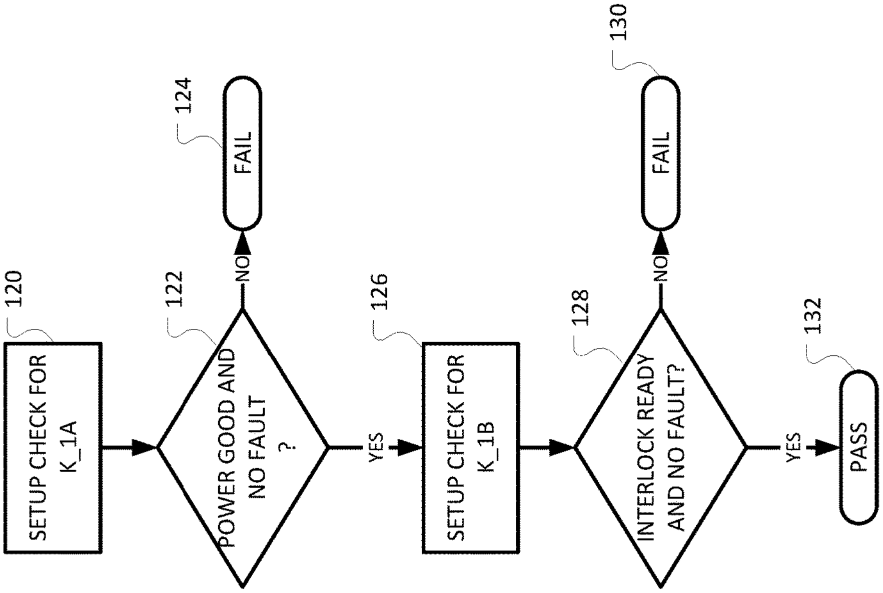

FIG. 7 shows a first test, referred to here as the K Fault test. This K Fault test checks the safety interlock relay 37 in the mainframe backplane 30 and then repeats for all modules installed that have interlocks. While the figures do not show the specific module test sequence, it is very similar to the interlock relay fault test of FIG. 7. The test begins at 120 by setting up the various signals discussed above for a first interlock test. In one embodiment, the test setup includes setting these signals with the following values: 5VINT_EN=0; INT_EN=0; INT_TEST=0; INT_RUN=0; and K_FAULT_TEST=0. After setup, at 122, the system performs a first interlock test by checking the 5VS power signal and the K_FAULT signal. If the power is not good, or the fault comes back true, the test fails at 124. If the test passes, the system sets up for the second interlock test at 126. In this embodiment this setup for the second interlock test means: 5VINT_EN=0; INT_EN=0; INT_TEST=0; INT_RUN=0; and K_FAULT_TEST=1. If, after the test at 128, the interlock is not ready or the second interlock failed, the test fails at 130. Generally, this failure indicates a downstream hardware failure, or the relay failed (stuck). If the second interlock passes the test, the overall test is passed at 132.

Figure 8:
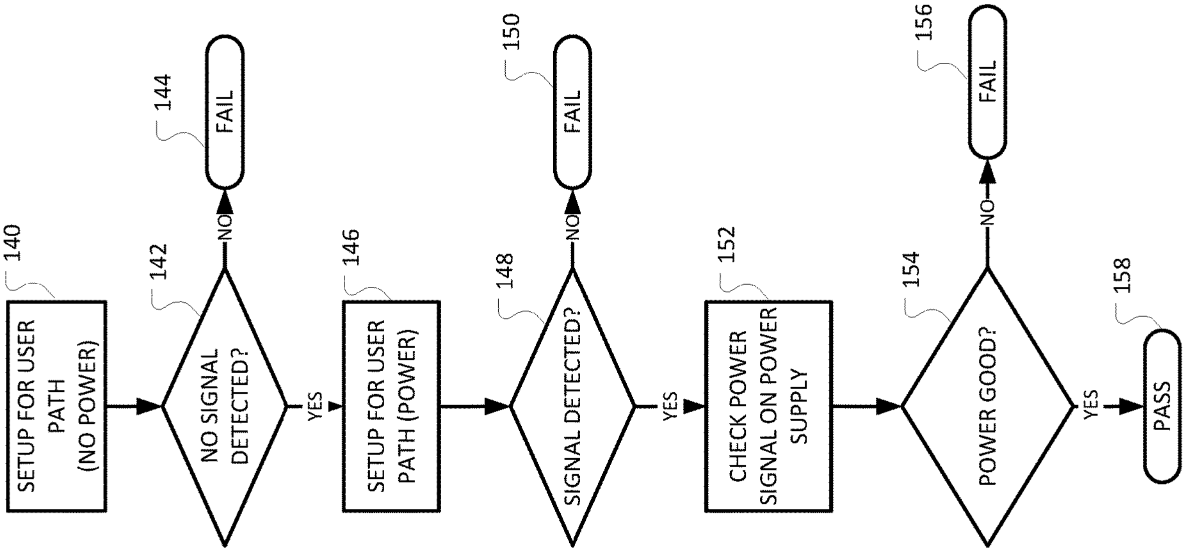
FIG. 7-10 show flowcharts of embodiments of test sequences.

FIG. 8 shows a second test sequence, which can be a user path test that tests the input returned by the user through contact 54 in FIG. 2. This user path test checks the wiring and ability for the user to actuate the mainframe interlock relay. At 140, the system sets up for a first user test with no power. In one embodiment, the settings for the first user test may be: 5VINT_EN=0; INT_EN=0; INT_TEST=0; INT_RUN=0; and K_FAULT_TEST=0. At 142, the system then checks the interlock return to detect a signal. If a system detects a signal, the test fails at 144 because the system did not expect a signal. This failure could mean that the user supply was connected or there is a fault of some sort in the user supply. If the test passes, the system sets up for a second user test with power applied at 146. The second user test itself may perform the same actions as the first user test. The settings for the second user test are the same, except that 5VINT_EN=1. At 148, the system attempts to detect a signal at the interlock return. The absence of a signal may indicate that the user has a wiring short, and the test fails at 150. The system then uses the same settings as the second user test to check the power signal on the power supply at 152 without having to setup for a third test. If the 5VINT_PG signal, or other power good indicator does not equal 1 at 154, the test fails at 156. This may indicate that the interlock power supply has a fault condition, such as a user wiring short to ground or the chassis. If that test passes, then the overall test passes at 158.

Figure 9:
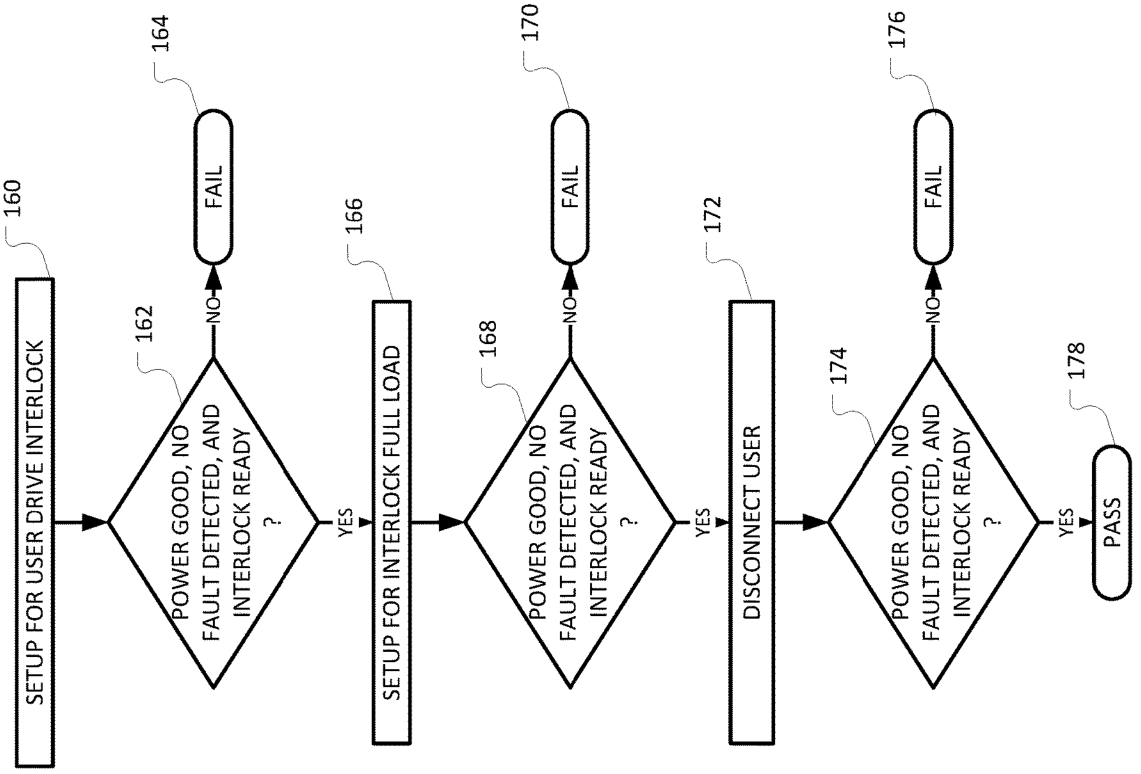
Figure 10:
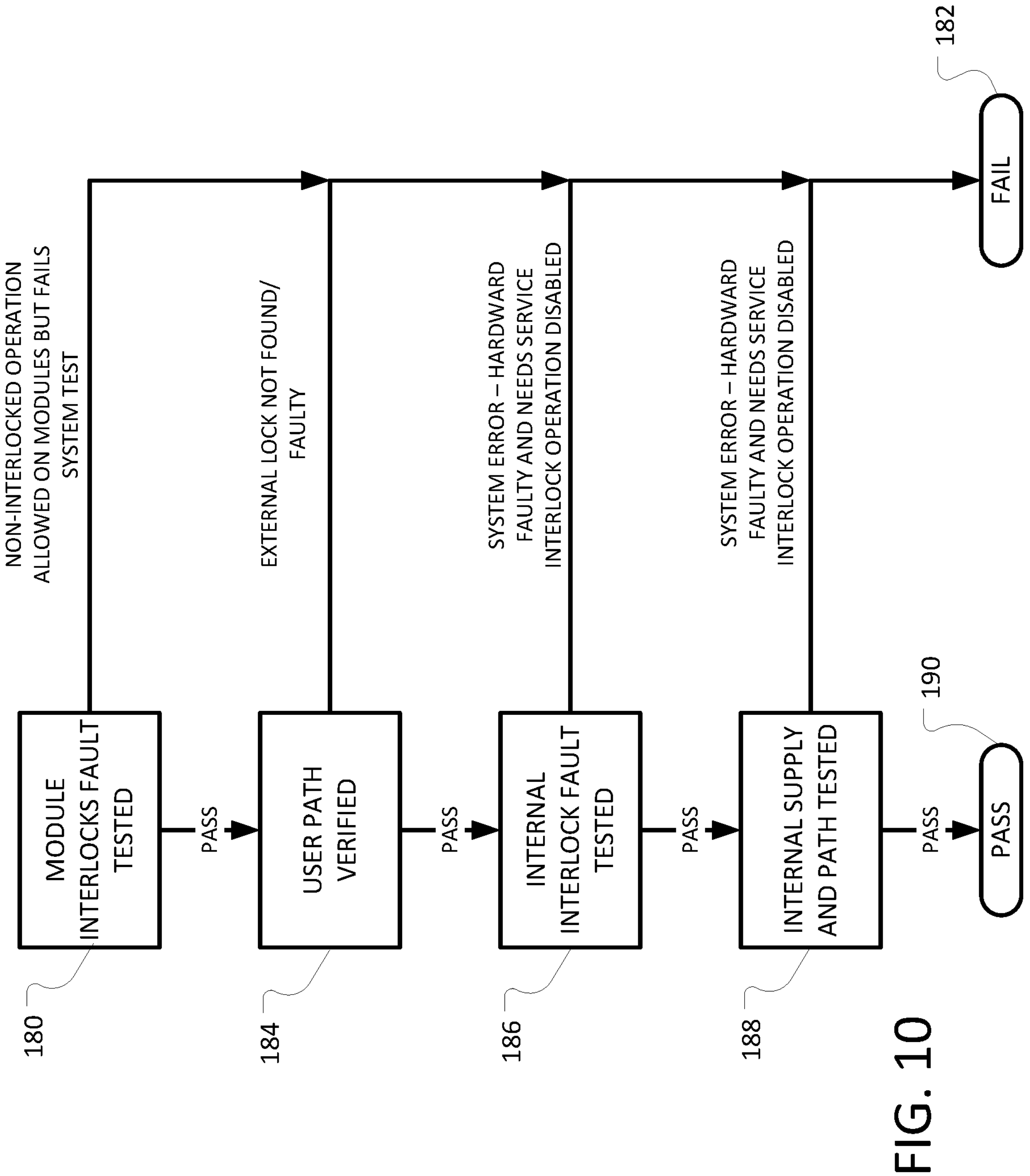

FIG. 9 shows a test sequence for a supply and load test associated with the module slots 38 in FIG. 2. This test loads the internal interlock relay with however many slots there are of interlock loading to exercise the supply's ability to deliver the required current. The embodiment of FIG. 2 shows six slots, so the interlock loading for the test will be set to mimic that number of modules. The module interlocks are disconnected during this test so that they do not actuate. At 160, the system sets up for a user drive interlock test. One embodiment involves the following settings: 5VINT_EN=1; INT_EN=1; INT_TEST=0; INT_RUN=0; and K_FAULT_TEST=0. After running the test, the system checks the power good signal at 162, whether a fault was detected, and if the interlock is ready. If any one of those is not true, the test fails at 164, possibly indicating that the user was unable to drive the interlock relay or has an internal fault. At 166, the system sets up for the same test but now with power applied. The settings remain the same except for INT_TEST, which is now set to 1. This test runs for as short a time as possible. The same checks as the previous test are checked at 168. If any condition fails, the test fails at 170, indicating an internal fault that prevented the internal interlock supply from driving the full interlock loads. The user may then be optionally disconnected at 172. Another test is performed with all settings set to 0. At 174, the same conditions as the two previous tests are checked, except that to pass the fault should be 0, and the INT_READY should also be 0. If any of those conditions fail, the test fails at 176, otherwise the test passes at 178.

The final test sequence comprises the integrity test, previously mentioned. This final sequence gathers the results of the previous testing to produce a pass/fail result returned to the user. If the test fails, the system gives information about what part of the system failed to the user. The module interlocks test at 180 determines the status of the interlocks, which may take the form of the test sequence of FIG. 7, applied to the modules 60 instead of the mainframe backplane 30. The user path test at 184 may take the form of the test of FIG. 8. The test of the internal interlock may take the form of the test of FIG. 7, applied to the mainframe backplane 30 at 186, and the test of the internal supply and load test at 188 may take the form of the test sequence of FIG. 9. If all previous tests have passed, the overall integrity test passes at 190. If any failed, the overall test fails at 182.

As mentioned previously, one should note that some embodiments may not involve all of the exact same tests in the exact sequences given. The overall approach of testing the interlocks in all parts of a system in a way that allows for them to be tested without applying the dangerous power levels has not been done before. Further, using a processor to monitor all the individual interlock test and then provide indication(s) of pass/fail, and if a failure, information about the failure(s) has also not been done before.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 a test and measurement system, comprising: one or more high voltage sources having a voltage high enough to be dangerous to users; an instrument backplane, having: one or more backplane double fault protected interlocks; a power signal; and one or more slots configured to accept one or more modules; and one or more processors configured to execute code that causes the one or more processors to: monitor one or more signals from the one or more backplane double fault protected interlocks; and without engaging any of the one or more high voltage sources, determine an operational state and faulted condition of each of the one or more backplane double fault protected interlocks, and check wiring of an interlock pathway between the test and measurement instrument and a user system.

Example 2 is the test and measurement system of Example 1, wherein the code that causes the one or more processors to monitor signals from the one or more backplane double fault interlocks comprises code to cause the one or more processors to: perform a module interlock test on module interlocks from any modules inserted into the one or more slots and receive signals resulting from the module interlock test; perform a user path test and receive a signal resulting from the user path test; perform an internal interlock test and receive a signal resulting from the internal interlock test; perform an internal supply and path test and receive a signal resulting from the internal supply and path test; and indicate that the test and measurement system has passed the test when the signal from the module interlock test, the signal from the user path test, the signal from the internal interlock test, and the signal from the internal supply and path test all indicate pass.

Example 3 is the test and measurement system of Example 2, wherein the one or more processors are further configured to execute code to indicate that the test and measurement system has failed when any of the signals from the module interlock test, the signal from the user path test, the signal from the internal interlock test, and the signal from the internal supply indicate fail.

Example 4 is the test and measurement system of Example 3, wherein the one or more processors are further configured to execute code to provide information about any test that failed.

Example 5 is the test and measurement system of any of Examples 1 through 4, wherein the code that causes the one or more processors to monitor one or more signals from the one or more backplane double fault protected interlocks causes the one or more processors to: perform a first test on the first interlock; run a second interlock test when the first interlock passes the first interlock test; and enable the test and measurement system when the second interlock passes the second interlock test.

Example 6 is the test and measurement system of any of Examples 1 through 5, further comprising an interface to a user system.

Example 7 is the test and measurement system of Example 6, wherein the one or more processors are further configured to execute code to cause the one or more processors to monitor one or more signals from the user system.

Example 8 is the test and measurement system of Example 7, wherein the code to cause the one or more processors to monitor one or more signals from the user system comprises code to cause the one or more processors to: run a first interlock return test on an interlock return contact without power being applied; apply power to the path if the interlock return signal passes the first interlock return test; run a second interlock return test on the interlock return; check a power status if the interlock return passes the second interlock return test; and enable the test and measurement system based upon the power status.

Example 9 is the test and measurement system of Example 5, wherein the code that causes the one or more processors to enable the test and measurement system based upon a power status causes the one or more processors to fail the system when the power status is in fault.

Example 10 is the test and measurement system of any of Examples 1 through 9, further comprising the one or more modules, each module having an interlock.

Example 11 is the test and measurement system of Example 10, wherein the one or more processors are further configured to execute code that causes the one or more processors to monitor one or more signals from the one or more modules.

Example 12 is the test and measurement system of Example 11, wherein the code that causes the one or more processors to monitor one or more signals from the one or more modules causes the one or more processors to: run a first test on a first module interlock on one module of the one or more modules; run a second test on a second module interlock on the one module when the first module interlock passes the first test; and enable the test and measurement system when the second module interlock passes the second test.

Example 13 is the test and measurement system of any of Examples 1 through 12, wherein the code that causes the one or more processors to monitor the one or more signals from the one or more backplane interlocks causes the one or more processors to monitor one or more signals from an internal interlock relay.

Example 14 is the test and measurement system of Example 13, wherein the code that causes the one or more processor to monitor the one or more signals from the internal interlock relay causes one or more processors to: run a user drive internal interlock relay test after a user circuit is connected; apply full power to the internal interlock relay when the internal interlock passes the internal interlock relay test; run a full power test to the internal interlock relay; disconnect the user circuit; send reset signals to the internal interlock relay; and indicating that the internal interlock relay has passed when the interlock relay resets.

Example 15 is the test and measurement system of Example 14, wherein the one or more processors are further configured to execute code that causes the one or more processors to indicate the interlock relay has failed when one of the user drive internal interlock relay test, the full power test, or the reset fails.

Example 16 is a method of controlling an interlock system comprising: performing a module interlock test on module interlocks from any modules inserted into one or more slots; receiving signals resulting from the module interlock test; performing a user path test; receiving a signal resulting from the user path test; performing an internal interlock test; receiving a signal resulting from the internal interlock test; performing an internal supply and path test; receiving a signal resulting from the internal supply and path test; and indicating that the interlock system passes when the signal from the module interlock test, the signal from the user path test, the signal from the internal interlock test, and the signal from the internal supply and path test all indicate pass.

Example 17 is the method of controlling the interlock system of Example 16, further comprising energizing the interlock system when the interlock system has passed the test.

Example 18 is the method of controlling the interlock of either of Examples 16 or 17, further comprising indicating the interlock system has failed when any of the signals from the module interlock test, the signal from the user path test, the signal from the internal interlock test, and the signal from the internal supply indicate fail.

Example 19 is the method of controlling the interlock system of Example 18, further comprising providing information about which of the tests failed.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A test and measurement system, comprising:
- one or more modules having a voltage high enough to be dangerous to users;
- an instrument backplane, having:
  - one or more backplane double fault protected interlocks;
  - a power signal coupled to the one or more backplane double fault protected interlocks; and
  - one or more slots coupled to the one or more backplane double fault protected interlocks and configured to accept the one or more modules; and
- one or more processors configured to execute code that causes the one or more processors to:
  - monitor one or more signals from the one or more backplane double fault protected interlocks; and
  - without engaging any of the one or more modules;
    - determine an operational state and faulted condition of each of the one or more backplane double fault protected interlocks; and
- check wiring of an interlock pathway between the one or more modules and a user system external to the test and measurement system.

2. The test and measurement system as claimed in claim 1, wherein the code that causes the one or more processors to monitor signals from the one or more backplane double fault protected interlocks comprises code to cause the one or more processors to:
- perform a module interlock test on module interlocks from any modules inserted into the one or more slots and receive signals resulting from the module interlock test;
- perform a user path test and receive a signal resulting from the user path test;
- perform an internal interlock test and receive a signal resulting from the internal interlock test;

perform an internal supply and path test and receive a signal resulting from the internal supply and path test; and indicate that the test and measurement system has passed the test when the signal from the module interlock test, the signal from the user path test, the signal from the internal interlock test, and the signal from the internal supply and path test all indicate pass.

3. The test and measurement system as claimed in claim 2, wherein the one or more processors are further configured to execute code to indicate that the test and measurement system has failed when any of the signals from the module interlock test, the signal from the user path test, the signal from the internal interlock test, and the signal from the internal supply and path test indicate fail.

4. The test and measurement system as claimed in claim 3, wherein the one or more processors are further configured to execute code to provide information about any test that failed.

5. The test and measurement system as claimed in claim 1, wherein the code that causes the one or more processors to monitor one or more signals from the one or more backplane double fault protected interlocks causes the one or more processors to:

perform a first interlock test on a first interlock relay of the one or more backplane double fault protected interlocks;

run a second interlock test on a second interlock relay of the one or more backplane double fault protected interlocks when the first interlock relay passes the first interlock test; and enable the test and measurement system when the second interlock relay passes the second interlock test.

6. The test and measurement system as claimed in claim 5, wherein the code that causes the one or more processors to enable the test and measurement system based upon a power status causes the one or more processors to fail the test and measurement system when the power status is in fault.

7. The test and measurement system as claimed in claim 1, wherein the one or more processors are further configured to execute code that causes the one or more processors to inform a user of a fault with any of the one or more backplane double fault protected interlocks.

8. The test and measurement system as claimed in claim 7, wherein the one or more processors are further configured to execute code to cause the one or more processors to monitor one or more signals from the user system.

9. The test and measurement system as claimed in claim 8, wherein the code to cause the one or more processors to monitor one or more signals from the user system comprises code to cause the one or more processors to:

run a first interlock return test on an interlock return contact without power being applied to the interlock pathway;

apply power to the interlock pathway if the interlock return contact passes the first interlock return test;

run a second interlock return test on the interlock return contact;

check a power status if the interlock return contact passes the second interlock return test; and enable the test and measurement system based upon the power status.

10. The test and measurement system as claimed in claim 1, further comprising the one or more modules, each module having an interlock.

11. The test and measurement system as claimed in claim 10, wherein the one or more processors are further configured to execute code that causes the one or more processors to monitor one or more signals from the one or more modules.

12. The test and measurement system as claimed in claim 11, wherein the code that causes the one or more processors to monitor one or more signals from the one or more modules causes the one or more processors to:

run a first test on a first module interlock on one module of the one or more modules;

run a second test on a second module interlock on the one module when the first module interlock passes the first test; and indicate that the one module passed the second test when the second module interlock passes the second test.

13. The test and measurement system as claimed in claim 1, wherein the code that causes the one or more processors to monitor the one or more signals from the one or more backplane double fault protected interlocks causes the one or more processors to monitor one or more signals from an internal interlock relay of the one or more backplane double fault protected interlocks.

14. The test and measurement system as claimed in claim 13, wherein the code that causes the one or more processors to monitor the one or more signals from the internal interlock relay causes the one or more processors to:

run a user drive internal interlock relay test after a user circuit the user system is connected to the test and measurement system;

apply full power to the internal interlock relay when the internal interlock relay passes the user drive internal interlock relay test;

run a full power test on the internal interlock relay;

disconnect the user system;

send reset signals to the internal interlock relay; and indicate that the internal interlock relay has passed when the internal interlock relay resets.

15. The test and measurement system as claimed in claim 14, wherein the one or more processors are further configured to execute code that causes the one or more processors to indicate the internal interlock relay has failed when one of the user drive internal interlock relay test, the full power test, or a reset of the internal interlock relay fails.

16. A method of controlling an interlock system comprising:

performing a module interlock test on module interlocks from any modules inserted into one or more slots;

receiving signals resulting from the module interlock test;

performing a user path test;

receiving a signal resulting from the user path test;

performing an internal interlock test;

receiving a signal resulting from the internal interlock test;

performing an internal supply and path test;

receiving a signal resulting from the internal supply and path test; and indicating that the interlock system passes when the signal from the module interlock test, the signal from the user path test, the signal from the internal interlock test, and the signal from the internal supply and path test all indicate pass.

17. The method of controlling the interlock system as claimed in claim 16, further comprising energizing the interlock system when the signal from the module interlock test, the signal from the user path test, the signal from the internal interlock test, and the signal from the internal supply and path test all indicate pass.

18. The method of controlling the interlock as claimed in claim 16, further comprising indicating the interlock system has failed when any of the signals from the module interlock test, the signal from the user path test, the signal from the internal interlock test, and the signal from the internal supply and path test indicate fail.

19. The method of controlling the interlock system as claimed in claim 18, further comprising providing information about which of the module interlock test, the user path test, the internal interlock test, and the internal supply and path test failed.

* * * * *